(12) United States Patent
Georgeson et al.

(10) Patent No.: US 11,738,886 B2
(45) Date of Patent: Aug. 29, 2023

(54) AUTOMATIC DIGITAL DATA FEEDBACK AND UTILIZATION IN AIRCRAFT PART LIFECYCLE

(71) Applicant: The Boeing Company, Chicago, IL (US)

(72) Inventors: Gary E. Georgeson, Tacoma, WA (US); Jeong-Beom Ihn, Bellevue, WA (US); William T. McDowell, Glen Carbon, IL (US)

(73) Assignee: The Boeing Company, Chicago, IL (US)

( * ) Notice: Subject to any disclaimer, the term of this patent is extended or adjusted under 35 U.S.C. 154(b) by 1021 days.

(21) Appl. No.: 16/459,081

(22) Filed: Jul. 1, 2019

(65) Prior Publication Data

US 2021/0002004 A1    Jan. 7, 2021

(51) Int. Cl.
 *G06F 30/15* (2020.01)
 *B64F 5/60* (2017.01)
 *B64F 5/10* (2017.01)

(52) U.S. Cl.
 CPC ............ *B64F 5/60* (2017.01); *B64F 5/10* (2017.01); *G06F 30/15* (2020.01); *Y02P 70/50* (2015.11)

(58) Field of Classification Search
 CPC .... B64F 5/60; B64F 5/10; G06F 30/15; Y02P 70/50
 See application file for complete search history.

(56) References Cited

U.S. PATENT DOCUMENTS

| | | | |
|---|---|---|---|
| 2013/0332011 A1* | 12/2013 | Ziarno | H04B 7/18506 701/3 |
| 2016/0260267 A1* | 9/2016 | Oesterling | G06F 30/15 |
| 2017/0068756 A1* | 3/2017 | Wilsher | G06F 30/18 |
| 2017/0148102 A1* | 5/2017 | Franke | G06K 9/6267 |
| 2018/0130269 A1* | 5/2018 | Scheid | G07C 5/085 |
| 2020/0184124 A1* | 6/2020 | Machalica | G06F 30/15 |

FOREIGN PATENT DOCUMENTS

EP    3229187 A1 * 10/2017 ............. B64D 45/00

OTHER PUBLICATIONS

Collares Pereira, S. Implementing a Design to Cost Strategy in a Complex Aerospace Design Project. Diss. Thesis to obtain the Master of Science Degree in Aerospace Engineering, University of Lisbon, 2015. (Year: 2015).*

* cited by examiner

*Primary Examiner* — James J Lee
*Assistant Examiner* — Andrew Sang Kim
(74) *Attorney, Agent, or Firm* — Kwan & Olynick LLP (57) ABSTRACT

An aircraft lifecycle in which digital data for an aircraft part is automatically collected, retained, and utilized to individualize aircraft inspection and maintenance is described. Several types of data, including non-destructive evaluation and measurement data and structural health monitoring data, are used in a feedback loop having various phases which may automatically receive data in digital format from other phases. In this manner the part being designed, fabricated, tested, and maintained for the aircraft is optimized and processes involved in the lifecycle of the part is made more efficient.

32 Claims, 8 Drawing Sheets

AUTOMATIC DIGITAL DATA FEEDBACK AND UTILIZATION IN AIRCRAFT PART LIFECYCLE

BACKGROUND

1. Field

This disclosure generally relates to aircraft evaluation and design using a software platform. More specifically, it relates to a platform or framework that enables feedback of data to various stages in the design, manufacture, and maintenance of aircraft parts.

2. Description of the Related Art

Presently, data collection and sharing in aircraft design, manufacture, testing, and maintenance is not performed with a common framework or platform which can be used to share data. In addition, the data comes in different formats. This varied-format of data collection has led to data silos in the aircraft or aerospace lifecycle. There is little or no automatic feedback of data from one stage to another. The data cannot used to impact the lifecycle.

SUMMARY

One aspect disclosed is a method of utilizing automatic feedback data in the lifecycle of an aircraft part. A part is designed based on lifecycle feedback including in-service data, manufacturing data, test feedback data, and design structure data. Feedback data are collected and transmitted in digital format and is used to derive the design of a part. Design of the part is validated by examining model feedback data, design input data, and special inspection data. The part is evaluated while in use wherein a current state of the part is compared with an original state of the part. The original state data is received from the validating phase. In-use data is automatically transmitted in digital format to the design phase. The structural integrity of the part is monitored while the part is being used. In this manner, an overall understanding of the structural health of the part is obtained, as well as data on how the part may age, thereby obtaining overall data relating to the part.

Another aspect disclosed is a system for enabling automatic feedback data in a framework for the lifecycle of an aircraft part. The framework may have a design module, a test module, a build module, and a manufacture validate module, wherein the modules automatically transmit or receive digital data from other modules that are relevant to a functions or objectives of the module. The types of data may vary widely and include but are not limited to aircraft part design, testing data and test feedback data, manufacturing and manufacturing equipment data, in-service evaluation data, in-service monitoring data, aircraft part life extension data, part fabrication and measurement validation data, and aircraft part finality data. These data are created, stored, transmitted, and received among these modules in the framework. These operations, for example, transmitting and receiving, are done automatically and in digital format. The framework may also include an in-service evaluation and measurement module, an in-service monitor module, a performance improvement module, and a part finality or part out module. Types of data among these modules include but are not limited to initial part scan data, part life prediction data, part repair data, part termination data, and sub-rejectable indication data.

Illustrative, non-exclusive examples of inventive features according to present disclosure are described in following enumerated paragraphs:

A1. Method (100) of utilizing automatic feedback data in a lifecycle (600) of an aircraft part, the method comprising:
designing (104) the aircraft part (200) based on in-service data, manufacturing-related data, and test feedback data, wherein a design of the aircraft part is derived;
testing (106, 108) the design of the aircraft part using model feedback data, design input data, and inspection data;
evaluating (300) the aircraft part while in use, thereby deriving in-use data, and wherein a current state of the aircraft part is compared with an original scan data of the aircraft part, the original scan data of the aircraft part received from a test stage (604), and wherein the in-use data is automatically transmitted to a design stage (602); and
monitoring (300) a structural integrity of the aircraft part while in use, wherein a structural health of the aircraft part is obtained.

A2. Method (100) of paragraph A1, wherein designing (102) the aircraft part further comprises using design structure data corresponding to a load and environment.

A3. Method (100) of paragraph A1, wherein the original state of the aircraft part includes part coordinate data.

A4. Method (100) of paragraph A1 further comprising receiving evaluation data, monitoring data, and repair data, the repair data including repair methodology and repair location (400).

A5. Method (100) of paragraph A1 further comprising modifying the aircraft part (110) using validation feedback data, evaluation feedback data, and monitoring feedback data.

A6. Method (100) of paragraph A1 further comprising:
receiving, at the design stage (102, 602), fabrication cost data and fabrication difficulty data from a build stage (606).

A7. Method (100) of paragraph A6 further comprising:
collecting manufacturing verification data and manufacturing equipment-related data at the build stage.

A8. Method (100) of paragraph A6 further comprising:
modifying the build stage (606) utilizing sub-rejectable indications data.

A9. Method (100) of paragraph A6 further comprising:
monitoring the build stage (606) and an operating environment in which the aircraft part operates.

A10. Method (100) of paragraph A1 further comprising:
receiving sub-scale test data and full-scale test data (604) at the design stage (602).

A11. Method (100) of paragraph A1 further comprising creating as-repaired data (306).

A12. Method (100) of paragraph A1 further comprising:
sending (408) the original scan data from a manufacture non-destructive evaluation stage to an in-service non-destructive evaluation stage automatically, wherein the original scan data is current structural state data of the aircraft part.

A13. Method (100) of paragraph A12 further comprising:
comparing (410) the original scan data with in-service non-destructive evaluation data after an event has occurred to an aircraft.

B1. Method (100-500) of utilizing automatic feedback data relating to an aircraft part, the method comprising:
receiving (206) testing data, in-service data, lifecycle data, and manufacture feedback data at a design stage (602);
designing (104) the aircraft part using the testing data, the in-service data, the lifecycle data, and the manufacture feedback data, thereby creating a design of the aircraft part;

receiving test instructions data from the design stage at a test stage (106);

testing the design of the aircraft part (108);

transmitting the testing stage data to the design stage and build-related test stage data to a build stage (206); and fabricating the aircraft part at the build stage (110).

B2. Method (100-500) of paragraph B1 wherein the in-service data includes in-service non-destructive evaluation data and in-service monitoring data.

C1. Automatic feedback data system (600, 700) comprising:

a design module (602) configured to create an aircraft part design (200) for an aircraft part and to automatically receive testing data, manufacturing data, in-service evaluation data, in-service monitoring data, aircraft part life extension data, and aircraft part finality data and to automatically transmit aircraft part design data;

a test module (604) configured to test (108) the aircraft part design and to automatically receive the aircraft part design and to automatically transmit digital test feedback data and the aircraft part design;

a build module (606) configured to facilitate fabrication of the aircraft part and to automatically receive the aircraft part design and to automatically transmit design improvement data and to collect manufacturing equipment quality data; and a manufacture-validate module (608) configured to validate aircraft part fabrication and aircraft part measurement and to automatically transmit digital manufacture validation data and to automatically create initial scan data of the aircraft part.

C2. Automatic feedback data system (600, 700) of paragraph C1 further comprising:

an in-service evaluation and measurement module (610) configured to evaluate the aircraft part and to automatically transmit digital evaluation data and to receive the initial scan data.

C3. Automatic feedback data system (600, 700) of paragraph C2 wherein the initial scan data includes structural state data of the aircraft part and coordinates of the aircraft part.

C4. Automatic feedback data system (600, 700) of paragraph C3 wherein the in-service evaluation and measurement module (610) is configured to compare the initial scan data with current aircraft part evaluation data.

C5. Automatic feedback data system (600, 700) of paragraph C3 wherein the design module (602) is configured to automatically transmit aircraft part testing instruction data.

C6. Automatic feedback data system (600, 700) of paragraph C1 further comprising:

an in-service monitor module (612) configured to collect aircraft part performance data and to track anomalies on the aircraft part and automatically transmitting monitoring data.

C7. Automatic feedback data system (600, 700) of paragraph C3 wherein aircraft part performance data is collected during operation of the aircraft.

C8. Automatic feedback data system (600, 700) of paragraph C1 further comprising:

a performance improvement module (614) configured to collect aircraft part life prediction data and aircraft part repair data and to automatically transmit aircraft part lifecycle analysis data and aircraft part repair analysis data.

C9. Automatic feedback data system (600, 700) of paragraph C1 further comprising:

a part finality module (616) configured to analyze the aircraft part at an aircraft part termination for wear, degradation, anomalies, and mechanical properties and to transmit aircraft part termination data.

C10. Automatic feedback data system (600, 700) of paragraph C1 wherein the test module (604) is configured to perform sub-scale testing and full-scale testing of the aircraft part design.

C11. Automatic feedback data system (600, 700) of paragraph C1 wherein the test module (604) is configured to perform hotspot testing of the aircraft part design.

C12. Automatic feedback data system (600, 700) of paragraph C1 wherein the manufacture validate module (608) is configured to collect sub-rejectable indication data (304) and as-repaired data (306).

Non-transitory computer-readable media embodies program code or executable computer instructions for implementing the methods, processes, routines, and sub-routines described herein. The program code to be executed, for example, implements methods for utilizing automatic feedback data in a lifecycle of an aircraft part and methods for utilizing automatic feedback data relating to an aircraft part.

DETAILED DESCRIPTION

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting. On the contrary, it is intended to cover alternatives, modifications, and equivalents as may be included within the spirit and scope of the described embodiments as defined by the appended claims.

Methods and systems of using non-destructive evaluation, inspection, and measurement data in the lifecycle of an aircraft to increase efficiency and utilization of data and create new parts of an aircraft are described in the various figures. The inspection and evaluation can also be described as sub-surface evaluation of a commercial or military aircraft. Measurement data may be described as quantifying the geometric structure of a part, determining the measurement between points, and rendering a full external representation of the part. Embodiments for improving the feedback on how well a part has performed so that the part can be improved and life extended are also described.

In some described embodiments, digital data is automatically collected, retained and transmitted throughout the lifecycle of an aircraft and used to individualize aircraft inspection and maintenance. In the described embodiment, the lifecycle of an existing aircraft part is illustrated. The processes described herein improve or increase efficiency of stages in the lifecycle of an aircraft or, more specifically, an individually designed and manufactured part in the aircraft.

At the design stage (also referred to as "phase") of the lifecycle, the design of an existing part of an aircraft may be improved or evolved based on feedback described below. In another embodiment, a new part or model may be designed from scratch using the automatic feedback loop described below. The underlying principle is to optimize the design, fabrication, utilization, repair/replacement, and surplus/recycling of the part by using data collected throughout the life cycle of the part. A primary goal is to manage the structural health of the part. The structure of a part is designed for certain loads and environments. One way to determine what design changes may be made to improve a part or come up with a new one is to look at volumetric points on or in a structure, referred to as voxels.

At the highest granular level, a segment of an airplane part has a history or story and may be examined to get a snapshot of the part's properties, such as strength, stiffness, what anomalies have formed, what repair work it has gone through, and so on. Data on a segment (e.g., a portion of the part) belonging to the part is gathered in a digital format. This volumetric data and, more broadly, the overall goal of the lifecycle, as noted, is to manage the structural health of the part. The data is used to see how the structure of the part ages and what the health of the part may be in the lifecycle.

At the design phase the designers seek an understanding of the health of the structure. In some embodiments, the design stage receives automatic feedback in the form of digital data from several other stages in the lifecycle. The designers automatically obtain what can be described as in-service data and analysis from in-service non-destructive evaluation and measurement (in-service NDE&M) and structural health management. They also automatically receive in-service monitoring digital data. These data may include data items conveying information such as "moisture is gathering at an ingress of the part from flying over water" and a wide array of information that may be useful to those designing the part. Through the framework the designers also receive lifecycle data and analysis from what are referred to as extend life and part out stages of the lifecycle. They also receive data from a build (also referred to as manufacture or fabrication) stage. These data may include cost data (e.g., too expensive to manufacture) or data indicating that the part was too difficult to manufacture, and the like. The designers may also automatically receive digital feedback data from the testing stage of the lifecycle. As noted below, the designers automatically transmit not only digital design data of the part to the test stage, but also specific data on what to test and how to test this part, which the designer may indicate as more important.

The next phase in the lifecycle is testing of the part as designed (the part has not been built or manufactured yet). Here structural and other aspects of the design are examined. Test feedback data is automatically transmitted to designers in digital format. If there is test data in other formats, this data is digitized. This test feedback data may include sub-scale testing or special testing of the part or segments of the part that are more important. At the testing stage, the framework gathers full-scale and sub-scale test data, if any, and transmits these data to designers. As noted above, the designers may provide specific test instructions or guidelines to the testers on how to test the design of the part, such as how to test the design, what to test for, and the like. Again, these test instructions data are transmitted automatically in digital format or with minimal manual intervention to the designers.

In some embodiments, the data transmitted between phases may be organized, labelled, transmitted at different times and to the relevant groups in a department, to facilitate efficient use of the data and to ensure that the data is utilized so that better decisions are made by the decision makers.

The next stage in the lifecycle is referred to as build. At this point the part has passed the design and testing stages and data has been shared to arrive at a well-tested design of a part. The design of the part has passed full-scale and sub-scale testing and hotspot inspection. It is here that the fabrication process for the part as designed takes place. It receives, in digital format from the testing stage, the design of the part. Builders may send digital design improvement feedback data to the designers if there are issues or difficulties with manufacturing the part as designed and suggest a re-design. This feedback is sent automatically to the designers when entered into the framework by builders. As is the case with the automatic feedback of digital data in the framework, there is no need to take the extra steps of contacting the designers, having discussions with them, or ensuring that their feedback makes it back to the designers in some manner or format and done so in a timely way; this is done by default. During the build stage, quality and verification data are collected as well as data around manufacturing equipment. Conventionally, data collected at the build stage was generally used to alter or adjust the fabrication process. With the platform of the described embodiments, quality verification data is used to ensure that the part is manufactured or fabricated as intended and that this data is used as well to improve future manufacturing. Manufacturing data is also used to monitor the overall fabrication process.

The phase after build may be referred to as manufacture non-destructive evaluation and measurement (NDE&M) or, for ease of explanation, the manufacture validate phase. Here digital feedback data may be used to optimize the build phase or manufacturing process of the part. The primary purpose is to validate the structure of the fabricated part. This validation involves a qualitative evaluation and measurement of the manufactured part, rather than a simple binary pass/fail type validation based on set criteria. In one embodiment, sensors are used to monitor the process of how it is manufactured, and the environment in which the part will be used, taking into account various factors, such as temperature, humidity, and the like. These sensors enable what may be referred to as in-situ monitoring and evaluation. That is, evaluating and measuring the part while it is being fabricated. In this manner, a defect found is discovered while it "is being made." Sub-rejectable indications may be collected and used to suggest a change in the manufacturing process or in the materials used to manufacture the part. This enables better and faster decisions on how to improve the manufacturing processes and costs. It also creates as-repaired data sets that enable better in-service assessments of anomalies relative to its repair analysis, repair decisions, and overall better maintenance actions over the life of the part.

The validate phase sends digital feedback data automatically to the build phase on how to possibly improve or optimize the manufacturing process. Evaluators in the validate phase automatically send initial scan data, described below, from the validate phase to the next phase, in-service NDE&M.

The phases after manufacture NDE&M represent a different part of the lifecycle. The manufacture NDE&M phase and those before it lead to an understanding of the design structure and manufacture process of the part. That is, the part is designed, tested, fabricated, and validated, all phases that lead to understanding and verification of the structure of the part, which as noted, may be an existing part that is being improved or a new part.

Starting with the in-service NDE&M phase, the framework provides an empirical, as well as holistic, understanding of the structural health of the part after it has been manufactured and has been used in an aircraft, in situ process monitoring. The next phase, the in-service NDE&M phase, is used in at least two situations. One is event response where an event or something unexpected has happened to the aircraft or to the part specifically. This event of course can be one or more of a wide variety of occurrences, such as lighting, a dent from luggage or cargo, hail, and so on. This phase also has an effect on planned structural inspections. It may potentially reduce the number of planned inspections. It transmits digital in-service evaluation data and analysis to the design phase where it can be used to improve or make changes to the design so that the number of planned inspections may be reduced or the inspection time itself is made shorter. This data can be used by designers so that the part is more resistant to the specific event. Similarly, evaluation data and analysis from an event occurring to the part is also automatically sent in digital format to designers for the same purpose.

As noted, the in-service NDE&M phase receives initial scan data from validation. This scan data reflects a current structural state of the part in the aircraft as well as part coordinate data of the exact location of the part, which in some cases, greatly facilitate locating the part in the airplane (a potentially difficult and time-consuming task) and reduces potential ambiguity as to whether the correct part is being inspected. Initial scan data from validation, sent automatically in digital format, is used to see what the part originally "looked" like when it was first designed and manufactured. By having it, a comparison can be made, for example, between the data from the in-service NDE&M, after an unexpected event has possibly caused an anomaly to the part, and the original data relating to the part. This phase also shares data with the repair phase and extended life phase, both described below. It may automatically send digital in-service data and analysis to the repair phase and receive repair feedback data.

A phase related to in-service NDE&M is the in-service monitor phase. These two phases share various types of data, such as ultrasonic (UT) or eddy current (EC) data used to size and track anomalies in the part. While NDE&M would be done by an inspector with the appropriate sensing equipment, monitoring (also called Structural Health Monitoring) is done using an on-aircraft sensing system with sensors mounted in often remote areas. While most of the other phases have conventionally been part of the lifecycle of an aircraft, this monitoring phase represents a more recent and growing area. It gathers data using different types of sensors (e.g., ultrasonic, vibrations, and the like) to monitor how the part is functioning or what it is doing during actual usage. A few factors that have driven growth in this area are the increasing tightness or compactness of parts in an aircraft making it difficult to reach a specific part, the availability of smaller and accurate sensors, and advancements in data collection and data analytics. This phase collects data that represents the structural integrity of a part at the moment, that is, in situ, providing "as-experienced" loads and usage and "as-experienced" dimensions data. For example, it collects data of what a part actually experienced during a hard landing or other unexpected flight event. This digital monitoring data gathered here is automatically shared with in-service NDE and with designers. It also shares data with the next two phases in the lifecycle.

The extended life and repair phases may be referred to collectively as an improved performance phase. These phases provide a holistic look at what the part may look like after a few years of use. The extended life phase focuses on collecting data relating to predicting the term of life of the part. The repair phase relates to repairing the design of the part when there is an unplanned event. The repair itself is done in situ, as is repair integrity monitoring. It also collects in situ load data, which is stress or strain data taken by sensors on or around the repair location while the aircraft is going through its flight operations. Typically, ultrasonic sensors or strain gauges would be used for this purpose. The extended life and repair phases share data since they are related and both automatically send digital data relating to lifecycle and analysis, specifically data and analysis that can be used by designers to help extend life of the part. The repair phase automatically sends a fair amount of data relating to how a repair was done to a part and the location of the repair of the part with both in-service phases.

This data is used to derive the story behind a voxel comprising the part, first described in the design phase. It, as well as life prediction data from extended life phase, is useful to the in-service modules as the data may affect how in-service NDE&M and monitoring is done on the part, since the structure of the part may have been modified in some way. As throughout the framework, this digital data is automatically sent from these improved performance phases to the in-service phases.

As noted, the data provides a holistic understanding of the part and of the design structure of the part. It enables more accurate predictions of what will likely or should happen over time to the part and measure whether they actually did. Similarly, it provides a reading on how accurate the in-service NDE&M phase was in its evaluation and inspection of the part. A determination may also be made as to whether the part can still be used. These 'extended life' and 'repair' phase may also be referred to as a sustainment phase, where part structural integrity and remaining life are determined from analysis of the inspection data that is collected. This data is used within these phases to predict life limits of the part and guide repairs.

Finally, a part out or part finality phase in the lifecycle provides opportunities for evaluation of the methods used to monitor and care for the part, as well as the analysis tools and methods that predict performance and the life of the part. Analysis of the part design can also be done. The part at its termination can be inspected for wear, degradation, anomalies, and mechanical properties. This data is valuable for improvement of any of the phases of the lifecycle data utilization. Improved part, maintenance practices, and analysis tools may result from the part out phase.

Figure 1:
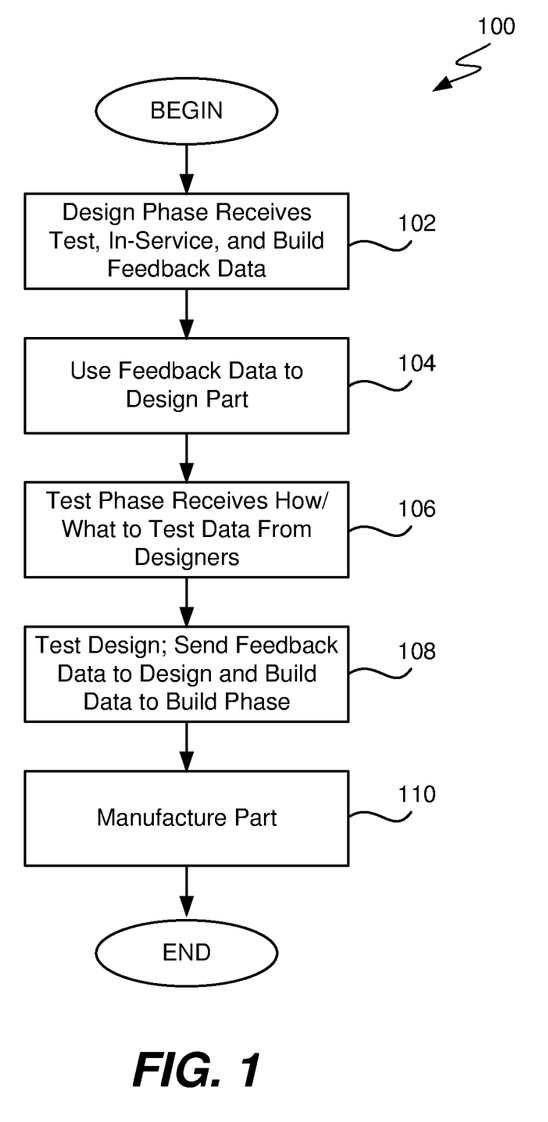
FIG. 1 is a flow diagram of an overview of segment of non-destructive evaluation and measurement (NDE&M) data utilization during an aircraft lifecycle in accordance with one embodiment.

Below are flow diagrams showing some of the processes and feedback loops described above. FIG. 1 is a flow diagram of an overview of segment of NDE&M data utilization during an aircraft lifecycle. Specifically, it shows phases from design to build. The process shown in FIG. 1 starts with the lifecycle already in progress. Step 102 shows the design phase receiving test feedback data and in-service feedback and analysis data. It also receives feedback data from the build phase. The designers may receive approximately six different types of input data from six phases in the lifecycle, in digital format and transmitted automatically to the appropriate employees, groups, departments, and the like working in the design phase.

At step 104 designers use the digital data received at step 102 to design a part or component of the aircraft. They may improve or change an existing part or design a new component. Once a part has been designed, the process moves to step 106 where the testing phase automatically receives data from the designers, data on what specifically to test with respect to a design and how to test it. At step 108 the testing phase performs the various types of design testing and automatically sends design testing feedback to designers. At step 110 the part is built or fabricated using input from the design and testing phases and from a validate phase, described below.

Figure 2:
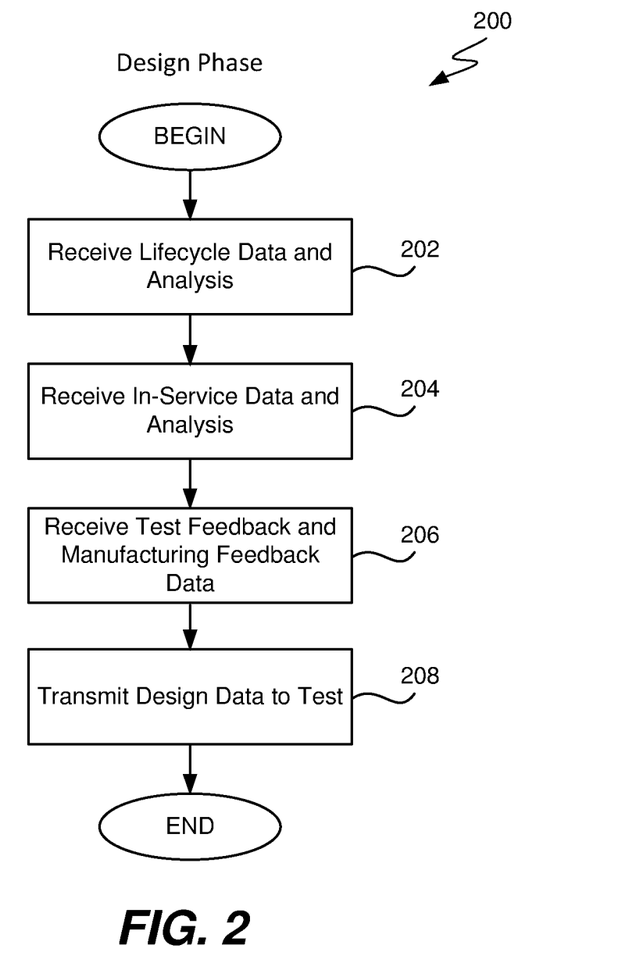
FIG. 2 is a flow diagram showing a process for a design phase in accordance with one embodiment.

FIG. 2 is a flow diagram showing a process for a design phase. Although the steps are shown sequentially in FIG. 2, they can be performed concurrently or in a different order. One or more of the steps may not occur for the design of a specific part. The designers receive various types of digital data from other phases. At step 202 they receive lifecycle data and analysis data from phases near the end of the lifecycle, specifically the extend life and part out phases. At step 204 the designers receives in-service and analysis data from the in-service NDE&M and in-service monitoring phases. At step 206 the designers receive test feedback from the testing phase and build feedback from the build phase. As noted, there may not be feedback sent automatically in digital format from the phases discussed to the design phase. However, if there is feedback, it is sent automatically to the appropriate departments. These characteristics are true for the flow in FIG. 1 and in the flow diagrams below as well. At step 208 the designers transmit the design data for the part to the testing phase, specifically, recommendations on what to test on the part and how to test it.

Figure 3:
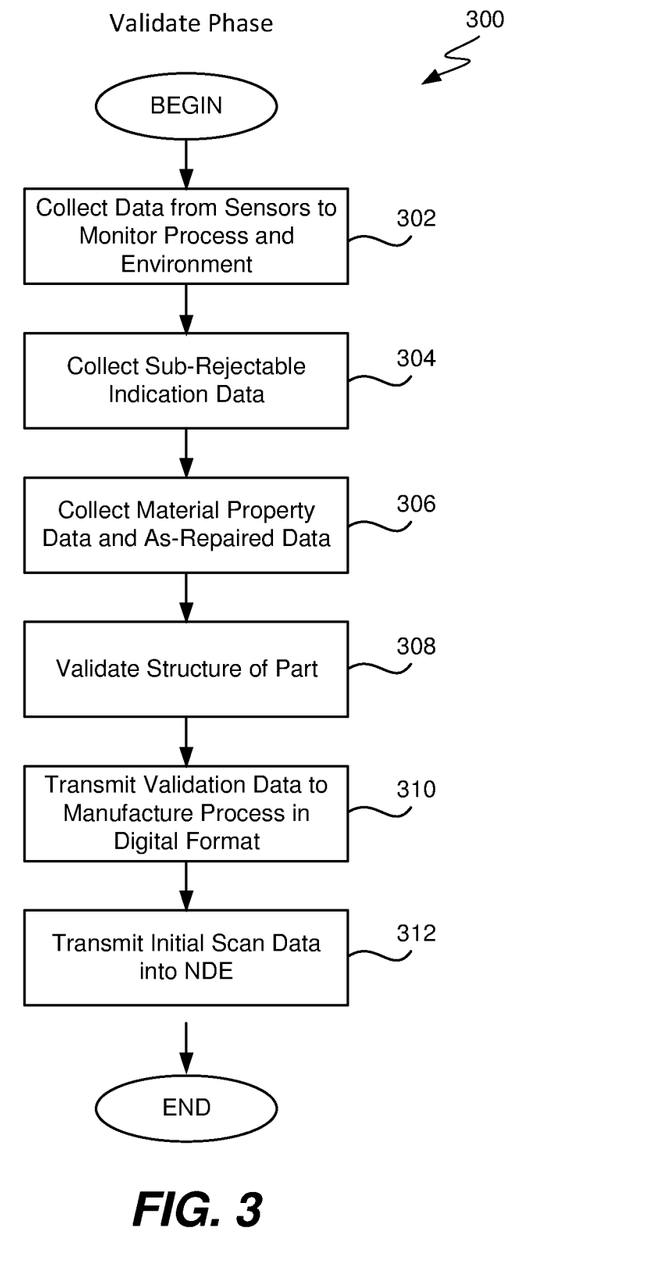
FIG. 3 is a flow diagram of a process showing a validate phase in accordance with one embodiment.

FIG. 3 is a flow diagram of a process showing a validate phase in accordance with one embodiment. The validate phase occurs after the part has been fabricated. At step 302 sensors are placed on, in, or around the part, as appropriate, and data is collected from the sensors to monitor processes used to fabricate the part and monitor the environment in which the part is used. The sensors are used to evaluate and measure the part while it is being fabricated. For example, they may be used to ensure that various requirements, such as dimensions, quality of consolidation, surface, lack of defects and other factors are met. At step 304 the validate phase collects sub-rejectable indication data from sensors. At step 306 material property and as-repaired data are collected. These data may be used to enable improved in-service assessments of anomalies to repair analysis, repair decisions, and overall maintenance actions over the life of the part. At step 308 the structure of the part is validated and data, including initial scan data, is gathered from validation. At step 310 validation data is transmitted in digital format to the fabrication phase. At step 312 initial scan and part coordinate data is transmitted to the NDE&M phase. These data may be used later to compare to scan data of the part when an evaluation and measurement is performed on the part to determine any differences in structure.

Figure 4:
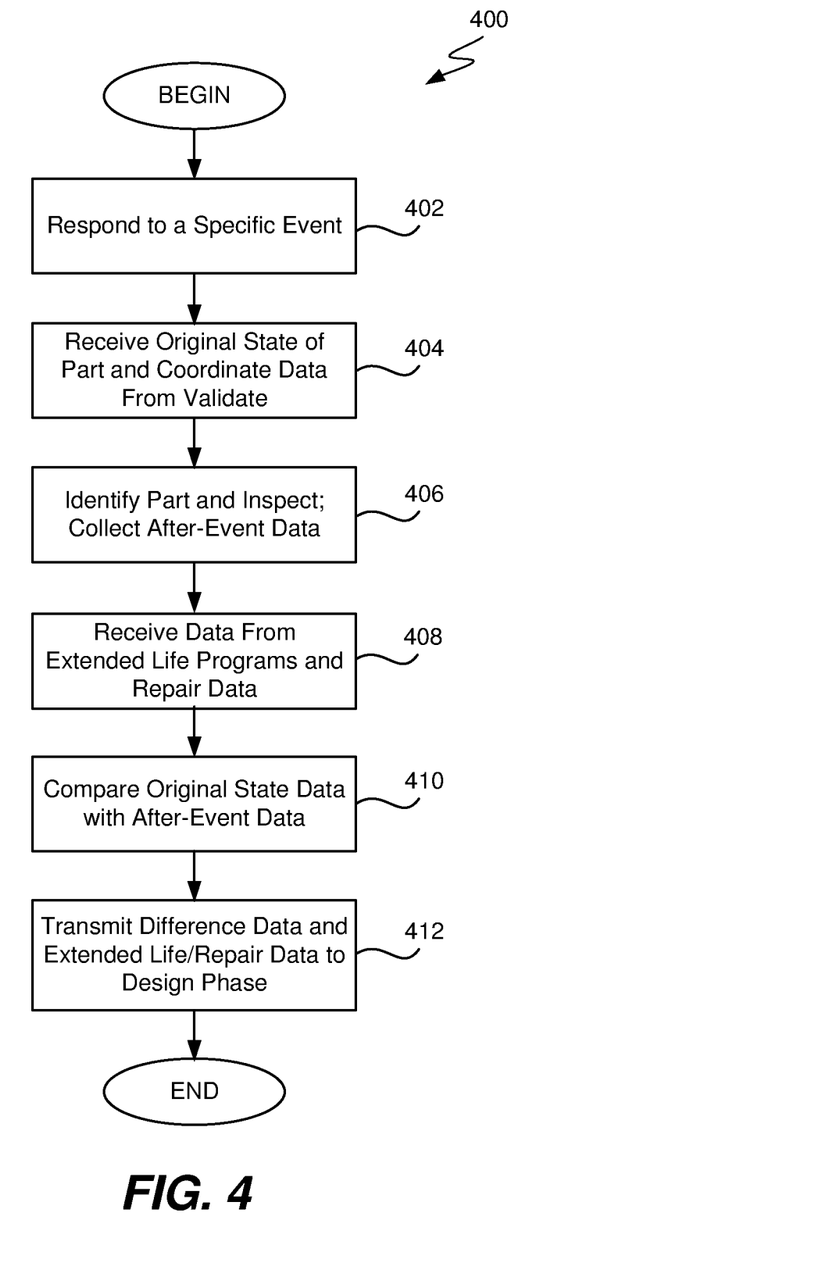
FIG. 4 is a flow diagram of a process of performing in-service NDE&M in accordance with one embodiment.

FIG. 4 is a flow diagram of a process of performing in-service NDE&M in accordance with one embodiment. At step 402 a specific event has occurred, such as an anomaly to a part of an aircraft or a detected fault and the in-service team responds to the event. At step 404 the team receives the original scan and part coordinate data of the part from the validate phase. At step 406 the part is identified and inspected and data on the part after the event is collected and analysis begins. At step 408 the in-service NDE&M team receives data from other phases, specifically the extended life and repair phases. At step 410 this data and the original scan data of the part are compared with the data collected after the event had occurred to the part. At step 412 the analysis and difference data from step 410 and the extended life and repair data are transmitted to the design phase.

Figure 5:
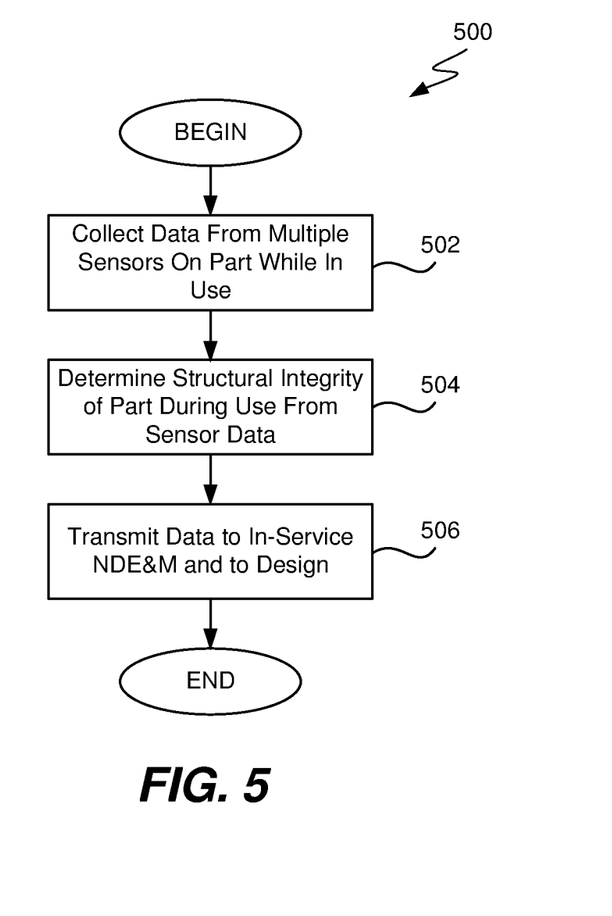
FIG. 5 is a flow diagram of a process of performing in-service monitoring in accordance with one embodiment.

FIG. 5 is a flow diagram of a process of performing in-service monitoring in accordance with one embodiment. This phase and the in-service NDE&M phase share various data types, such as ultrasonic data and eddy current data. At step 502 data is collected from one or more sensors on the part while the part is being used. At step 504 the structural integrity of the part is determined by examining data from the sensors while the part is in use. This provides loads and usage data and dimensions data while the part is in flight operation. At step 506 the structural integrity data is transmitted to in-service NDE&M and design teams in digital format.

Figure 6:
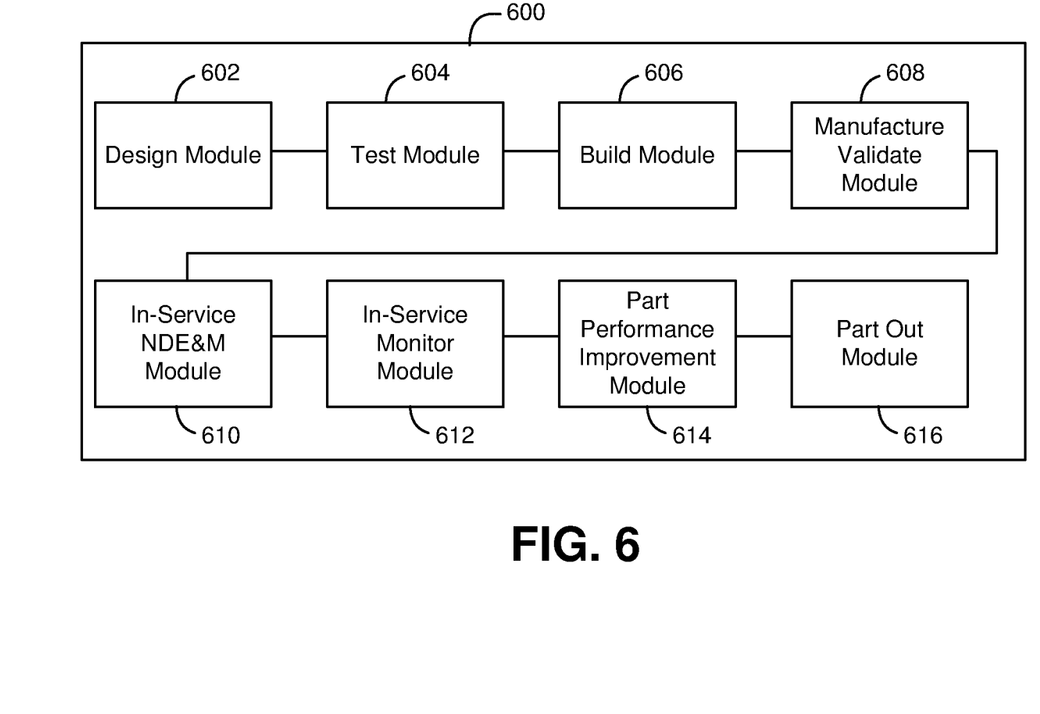
FIG. 6 is a block diagram showing modules in the aircraft lifecycle.

FIG. 6 is a block diagram of one or more systems for implementing a feedback data generation and utilization framework for an aircraft part in accordance with one embodiment. One or more computing systems 600 execute multiple software modules which collectively implement the automatic digital data feedback loop described above. As is evident from the discussion below, a module generally represents or manifests one or more phases in the data feedback framework. Not every software module shown in FIG. 6 is necessarily executed in a feedback loop for a specific aircraft part. Some may not be needed and may not be part of the framework for that particular part. Similarly, some of the data created or stored by a particular module may not be transmitted to another module, nor may a module necessarily receive data from another even though it is configured to do so. With respect to the flow diagrams described above, not all phases may be needed for a particular part and, similarly, some of the data that a phase is configured to receive, transmit, or collect may not materialize or be generated. A design module 602 executes software for enabling creation of an aircraft part design. The design is stored in a digital format and transmitted to a test module 604. Instructions and guidelines on how to test the part may also be transmitted to test module 604. Design module 602 may receive digital data for the part specifically relating to testing, fabrication or manufacturing, in-service evaluation, in-service monitoring, life extension, and finality, referred to above as part out.

Test module 604 receives the digital format design from design module 602 and test instructions data on how the part may be tested. Test module 604 performs various tests on the part design, such as hotspot testing and sub-scale and full-scale testing, some of which may focus on the instructions and guidelines sent from design module 602. Test module 604 transmits digital test feedback data to design module 602 and the digitally formatted design to a build module 606. This module executes software that facilitates manufacture or fabrication of the part and automatically storing a wide variety of manufacture-related data in a digital format. The module receives the design of the part automatically from test module 604. It may transmit design improvement data, such as cost reduction and manufacturing efficiency data to design module 602. Data on the quality and operation of the manufacturing equipment may also be collected and stored by build module 606.

A manufacture validate module 608 examines the physical aircraft part after it has been fabricated. Manufacture validate module 608 executes software to validate the quality of the fabrication of the part and part measurement. Manufacture validate module 608 collects digital manufacturing evaluation data and creates initial or original scan data of the aircraft part. Manufacture validate module 608 executes software to obtain sub-rejectable indications data and as-repaired data sets. In-service non-destructive evaluation and measurement module 610. This in-service evaluation and measurement module is configured to evaluate manufacturing processes of the aircraft part, to transmit this digital evaluation data, and to receive initial scan data of the part, which may include structural state and coordinates of the part. It is also configured to compare the initial scan data with current part data.

In-service monitor module 612 collects data relating to the aircraft part performance during actual flight operation of the aircraft. In-service monitor module 612 may also track anomalies to the part and transmit the monitoring data to other modules. Part performance improvement module 614 collects part life prediction data and repair data. It performs analysis on this data and transmits what may be referred to as part lifecycle analysis data and part repair analysis data to other modules. A part out or part finality module 616 analyzes the part at the termination of its use. It may examine the part for wear, degradation, anomalies, and its mechanical properties which may be different at part termination than its properties at fabrication or initial use.

Figure 7:
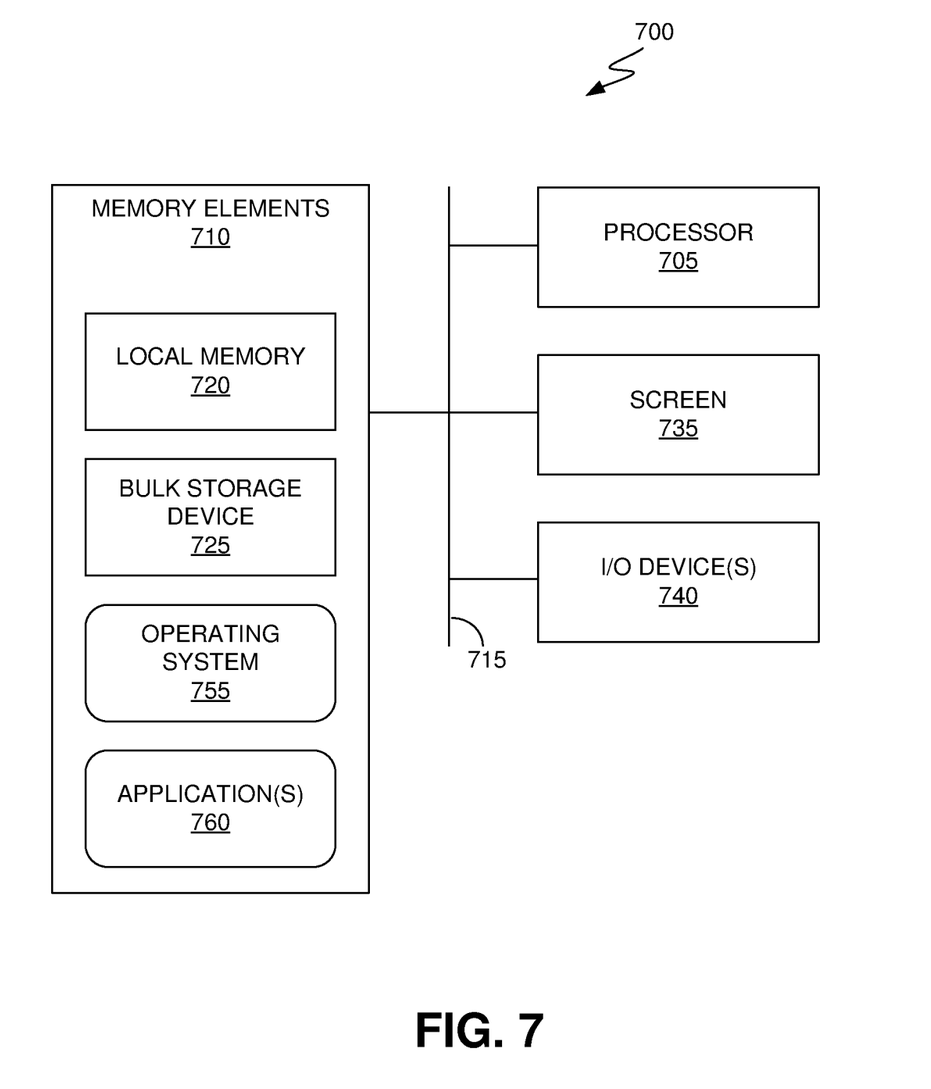
FIG. 7 is a block diagram of a data processing system in accordance with one embodiment.

FIG. 7 is a block diagram of a data processing system 700 in accordance with one embodiment. System 700 may be used to implement any of a variety of systems and/or computing devices that include a processor and memory and that are capable of performing the operations described within this disclosure. It can be used to execute computer instructions to implement processes in flowcharts in FIGS. 1 to 5 and the system of FIG. 6.

As pictured, system 700 includes at least one processor 705 coupled to memory elements 710 through a system bus 715 or other suitable circuitry such as an input/output (I/O) subsystem. System 700 stores program code within memory elements 710. Processor 705 executes the program code accessed from memory elements 710 via system bus 715. Memory elements 710 include one or more physical memory devices such as, for example, a local memory 720 and one or more bulk storage devices 725. Local memory 720 refers to random access memory (RAM) or other non-persistent memory devices generally used during actual execution of the program code. Bulk storage device 725 may be implemented as a hard disk drive (HDD), solid state drive (SSD), or other persistent data storage device. System 700 may also include one or more cache memories (not shown) that provide temporary storage of at least some program code in order to reduce the number of times program code must be retrieved from bulk storage device 725 during execution.

System 700 may be coupled to one or more I/O devices such as a screen 735 and one or more additional I/O device(s) 740. The I/O devices described herein may be coupled to system 700 either directly or through intervening I/O controllers. In one aspect, screen 735 may be implemented as a display device that is not touch sensitive. In another aspect, screen 735 may be implemented as a display device that is touch sensitive.

Examples of I/O devices 740 may include, but are not limited to, a universal remote control device, a keyboard, a mobile device, a pointing device, a controller, a camera, a speaker, and a microphone. In some cases, one or more of the I/O devices may be combined as in the case where a touch sensitive display device (e.g., a touchscreen) is used as screen 735. In that case, screen 735 may also implement a keyboard and a pointing device. Other examples of I/O devices 740 may include sensors. Exemplary sensors may include, but are not limited to, an accelerometer, a light sensor, touch screen sensors, one or more biometric sensors, a gyroscope, a compass, or the like.

I/O devices 740 may also include one or more network adapter(s). A network adapter is a communication circuit configured to establish wired and/or wireless communication links with other devices. The communication links may be established over a network or as peer-to-peer communication links. Accordingly, network adapters enable system 700 to become coupled to other systems, computer systems, remote printers, and/or remote storage devices, such as remote servers storing content. Examples of network adapter(s) may include, but are not limited to, modems, cable modems, Ethernet cards, wireless transceivers, whether short and/or long range wireless transceivers (e.g., cellular transceivers, 802.11x (Wi-Fi™) compatible transceivers, Bluetooth® compatible transceivers, and the like).

As pictured in FIG. 7, memory elements 710 may store an operating system 755 and one or more application(s) 760, such as applications for translating symbols and zero-amplitude time durations and symbol mapping tables. It may also store software for segmenting or breaking a message (to be transmitted) into pieces or segments that can be represented by symbols. In one aspect, operating system 755 and applications 760, being implemented in the form of executable program code, are executed by system 700 and, more particularly, by processor 705. As such, operating system 755 and application(s) 760 may be considered an integrated part of system 700. Operating system 755, applications 760, and any data items used, generated, and/or operated upon by system 700 are functional data structures that impart functionality when employed as part of system 700.

In one aspect, system 700 may be used to implement a computer, such as a personal computer, a server, or the like. Other examples of mobile computing devices may include, but are not limited to, a tablet computer, a mobile media device, a game console, a mobile internet device (MID), a laptop computer, a mobile appliance device, or the like. System 700 may also be configured to read computer instructions or program code from a computer readable medium.

System 700 may include fewer components than shown or additional components not illustrated in FIG. 7 depending upon the particular type of device that is implemented. In addition, the particular operating system and/or application(s) included may also vary according to device type as may the types of network adapter(s) included. Further, one or more of the illustrative components may be incorporated into, or otherwise form a portion of, another component. For example, a processor may include at least some memory.

Figure 8:
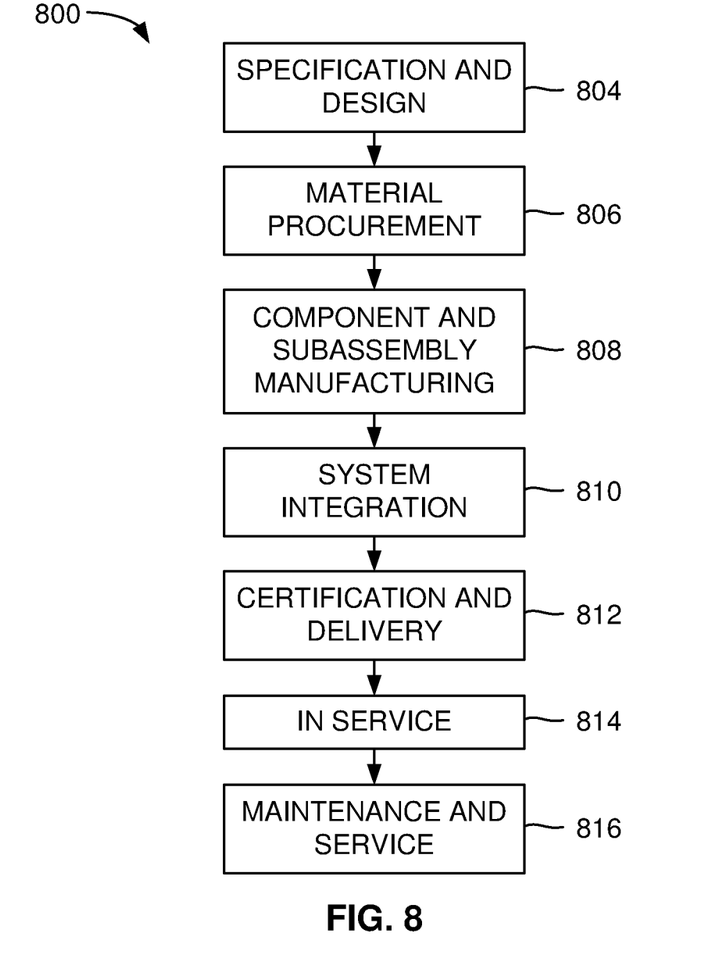
FIG. 8 is a flow diagram of an aircraft manufacturing and service method in accordance with one embodiment.
Figure 9:
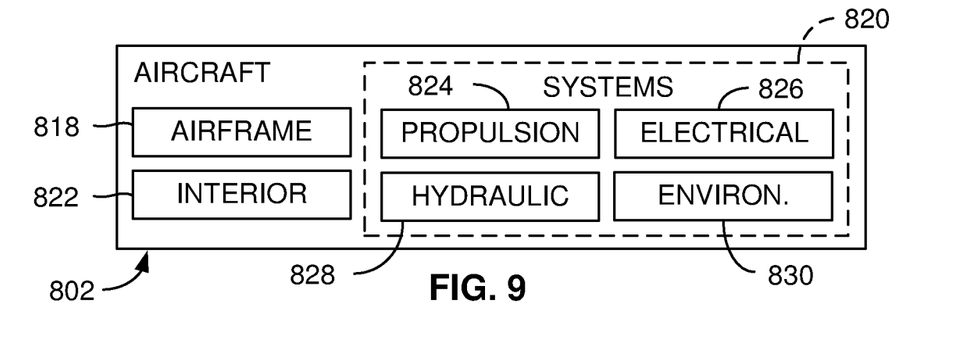
FIG. 9 is a block diagram showing components of an aircraft in accordance with one embodiment.

An aircraft manufacturing and service method 800 is shown in FIG. 8 and aircraft 802 is shown in FIG. 9. During pre-production, method 800 may include specification and design 804 of aircraft 802 and material procurement 806. During production, component and subassembly manufacturing stages 808 and system integration stage 810 of aircraft 802 takes place. Thereafter, aircraft 802 may go through certification and delivery 812 in order to be placed in service 814. While in service by a customer, aircraft 802 is scheduled for routine maintenance and service 816 (which may also include modification, reconfiguration, refurbishment, and so on).

Each of the processes of method 800 may be performed or carried out by a system integrator, a third party, and/or an operator (e.g., a customer). For the purposes of this description, a system integrator may include without limitation any number of aircraft manufacturers and major-system subcontractors; a third party may include without limitation any number of vendors, subcontractors, and suppliers; and an operator may be an airline, leasing company, military entity, service organization, and so on.

As shown in FIG. 9, aircraft 802 produced by method 800 may include an airframe 818 with high-level systems 820 and interior 822. Examples of high-level systems 820 include one or more of a propulsion system 824, an electrical system 826, a hydraulic system 828, and an environmental system 830. Although an aerospace example is shown, the principles of the examples described herein may be applied to other industries.

Devices and methods embodied herein may be employed during any one or more of the stages of method 800. For example, components or subassemblies corresponding to stages 808 and 810 may be fabricated or manufactured in a manner similar to components or subassemblies produced while aircraft 802 is in service. Also, one or more device examples, method examples, or a combination thereof may be utilized during stages 808 and 810, for example, by substantially expediting assembly of or reducing the cost of aircraft 802. Similarly, one or more of device examples, method examples, or a combination thereof may be utilized while aircraft 802 is in service, for example and without limitation, for maintenance and service 816.

Therefore, it is to be understood that the present disclosure is not to be limited to the specific examples illustrated and that modifications and other examples are intended to be included within the scope of the appended claims. Moreover, although the foregoing description and the associated drawings describe examples of the present disclosure in the context of certain illustrative combinations of elements and/or functions, it should be appreciated that different combinations of elements and/or functions may be provided by alternative implementations without departing from the scope of the appended claims. Accordingly, parenthetical reference numerals in the appended claims are presented for illustrative purposes only and are not intended to limit the scope of the claimed subject matter to the specific examples provided in the present disclosure.

What is claimed is:

1. A method of utilizing automatic feedback data in a lifecycle of an aircraft part, the method comprising:
designing the aircraft part based on in-service data automatically obtained from a plurality of different sensors for monitoring what a same aircraft part actually experiences during flight, manufacturing-related data, and test feedback data, wherein a design of the aircraft part is derived;
testing the design of the aircraft part using model feedback data, design input data, and inspection data;
evaluating the aircraft part while in use, thereby deriving additional in-service data, and wherein a current state of the aircraft part is compared with an original scan data of the aircraft part, the original scan data of the aircraft part received from a test stage, and wherein the additional in-service data is automatically transmitted to a design stage, wherein the original scan data of the aircraft part includes part coordinates data for locating the part in the aircraft; and
with a plurality of different sensors, monitoring a structural integrity, including an as-experienced load and as-experienced dimensions data, of the aircraft part while in use, wherein a structural health of the aircraft part is obtained based on the monitored structural health and automatically transmitted as additional in-service data to a design stage.

2. The method as recited in claim 1 wherein designing the aircraft part further comprises using design structure data corresponding to a load and environment.

3. The method as recited in claim 1 further comprising:
receiving evaluation data, monitoring data, and repair data, the repair data including repair methodology and repair location.

4. The method as recited in claim 1 further comprising:
modifying the aircraft part using validation feedback data, evaluation feedback data, and monitoring feedback data.

5. The method as recited in claim 1 further comprising:
receiving, at the design stage, fabrication cost data and fabrication difficulty data from a build stage.

6. The method as recited in claim 5 further comprising:
collecting manufacturing verification data and manufacturing equipment-related data at the build stage.

7. The method as recited in claim 5 further comprising:
modifying the build stage utilizing sub-rejectable indications data.

8. The method as recited in claim 5 further comprising:
monitoring the build stage and an operating environment in which the aircraft part operates.

9. The method as recited in claim 1 further comprising:
receiving sub-scale test data and full-scale test data at the design stage.

10. The method as recited in claim 1 further comprising creating as-repaired data.

11. The method as recited in claim 1 further comprising:
sending the original scan data from the test stage to an in-service non-destructive evaluation stage automatically, wherein the original scan data is compared to current structural state data, including current load and dimensions data, of the aircraft part obtained via a plurality of sensors during use.

12. The method as recited in claim 11 further comprising:
comparing the original scan data with in-service non-destructive evaluation data after an event has occurred to an aircraft.

13. A method of utilizing automatic feedback data relating to an aircraft part, the method comprising:
receiving testing data, in-service data automatically obtained from a plurality of different sensors for monitoring what a same aircraft part actually experiences during flight, lifecycle data, and manufacture feedback data at a design stage;
designing the aircraft part using the testing data, the in-service data, the lifecycle data, and the manufacture feedback data, thereby creating a design of the aircraft part;
receiving test instructions data from the design stage at a test stage;
testing the design of the aircraft part;
transmitting the testing stage data to the design stage and build-related test stage data to a build stage;
fabricating the aircraft part at the build stage; and evaluating the aircraft part while in use, thereby deriving additional in-service data, and wherein a current state of the aircraft part is compared with an original scan data of the aircraft part, the original scan data of the aircraft part received from a test stage, and wherein the additional in-service data is automatically transmitted to a design stage, wherein the original scan data of the aircraft part includes part coordinates data for locating the part in the aircraft.

14. The method as recited in claim 13 wherein the in-service data includes in-service non-destructive evaluation data and in-service monitoring data, including an as-experienced load and as-experienced dimensions data automatically obtained from a plurality of different sensors while the aircraft part is in use.

15. An automatic feedback data system comprising:
   at least one processor; and
   at least one memory,
   wherein the at least one processor and at least one memory are configured to:
create an aircraft part design for an aircraft part and to automatically receive testing data, manufacturing data, in-service evaluation data, in-service monitoring data automatically obtained from a plurality of different sensors for monitoring what a same aircraft part actually experiences during flight, aircraft part life extension data, and aircraft part finality data and to automatically transmit aircraft part design data;
   test the aircraft part design and to automatically receive the aircraft part design and to automatically transmit digital test feedback data and the aircraft part design;
   facilitate fabrication of the aircraft part and to automatically receive the aircraft part design and to automatically transmit design improvement data and to collect manufacturing equipment quality data;
   validate aircraft part fabrication and aircraft part measurement and to automatically transmit digital manufacture validation data and to automatically create initial scan data, including part coordinates data for locating the aircraft part in the aircraft, and
   evaluate the aircraft part and to automatically transmit digital evaluation data and to receive the initial scan data, wherein the initial scan data includes structural state data of the aircraft part and coordinates for locating the aircraft part in the aircraft, wherein the initial scan data is compared with current aircraft part evaluation data.

16. The automatic feedback data system as recited in claim 15 wherein the at least one processor and at least one memory are configured to: automatically transmit aircraft part testing instruction data.

17. The automatic feedback data system as recited in claim 15
   wherein the at least one processor and at least one memory are configured to:
   collect aircraft part performance data from a plurality of sensors during use of the aircraft part and to track anomalies on the aircraft part and automatically transmitting monitoring data.

18. The automatic feedback data system as recited in claim 15 wherein aircraft part performance data is collected during operation of the aircraft.

19. The automatic feedback data system as recited in claim 15
   wherein the at least one processor and at least one memory are configured to:
   collect aircraft part life prediction data and aircraft part repair data and to automatically transmit aircraft part lifecycle analysis data and aircraft part repair analysis data.

20. The automatic feedback data system as recited in claim 15 further comprising:
   wherein the at least one processor and at least one memory are configured to:
   analyze the aircraft part at an aircraft part termination for wear, degradation, anomalies, and mechanical properties and to transmit aircraft part termination data.

21. The automatic feedback data system as recited in claim 15 wherein the at least one processor and at least one memory are configured to:
   perform sub-scale testing and full-scale testing of the aircraft part design.

22. The automatic feedback data system as recited in claim 15 wherein the at least one processor and at least one memory are configured to:
   perform hotspot testing of the aircraft part design.

23. The automatic feedback data system as recited in claim 15 wherein the at least one processor and at least one memory are configured to:
   collect sub-rejectable indication data and as-repaired data.

24. A non-transitory computer-readable medium embodying program code, the program code to be executed to implement a method of utilizing automatic feedback data in a lifecycle of an aircraft part, the program code comprising:
   program code for designing the aircraft part based on in-service data automatically obtained from a plurality of different sensors for monitoring what a same aircraft part actually experiences during flight, manufacturing-related data, and test feedback data, wherein a design of the aircraft part is derived;
   program code for testing the design of the aircraft part using model feedback data, design input data, and inspection data;
   program code for evaluating the aircraft part while in use, thereby deriving additional in-service data, and wherein a current state of the aircraft part is compared with an original scan data of the aircraft part, the original scan data of the aircraft part received from a test stage, and wherein the additional in-service data is automatically transmitted to a design stage, wherein the original scan data of the aircraft part includes part coordinates data for locating the part in the aircraft; and
   program code for monitoring via a plurality of different sensors a structural integrity of the aircraft part, including an as-experienced load and as-experienced dimensions data, while in use, wherein a structural health of the aircraft part is obtained based on the monitored structural health and automatically transmitted as additional in-service data to a design stage.

25. The non-transitory computer-readable medium embodying program code as recited in claim 24 further comprising:
   program code for receiving evaluation data, monitoring data, and repair data, the repair data including repair methodology and repair location.

26. The non-transitory computer-readable medium embodying program code as recited in claim 24 further comprising:
   program code for modifying the aircraft part using validation feedback data, evaluation feedback data, and monitoring feedback data.

27. The non-transitory computer-readable medium embodying program code as recited in claim 24 further comprising:

program code for sending the original scan data from a manufacture non-destructive evaluation stage to an in-service non-destructive evaluation stage automatically, wherein the original scan data is compared to current structural state data, including current load and dimensions data, of the aircraft part obtained via a plurality of sensors during use.

28. The non-transitory computer-readable medium of claim 24, wherein designing the aircraft part further comprises using design structure data corresponding to a load and environment.

29. The non-transitory computer-readable medium of claim 24, the program code further comprising:

computer code for modifying the aircraft part using validation feedback data, evaluation feedback data, and monitoring feedback data.

30. A non-transitory computer-readable medium embodying program code, the program code to be executed to implement a method of utilizing automatic feedback data relating to an aircraft part, the program code comprising:

program code for receiving testing data, in-service data automatically obtained from a plurality of different sensors for monitoring what a same aircraft part actually experiences during flight, lifecycle data, and manufacture feedback data at a design stage;

program code for designing the aircraft part using the testing data, the in-service data, the lifecycle data, and the manufacture feedback data, thereby creating a design of the aircraft part;

program code for receiving test instructions data from the design stage at a test stage;

program code for testing the design of the aircraft part;

program code for transmitting the testing stage data to the design stage and build-related test stage data to a build stage;

program code for fabricating the aircraft part at the build stage; and program code for evaluating the aircraft part while in use, thereby deriving additional in-service data, and wherein a current state of the aircraft part is compared with an original scan data of the aircraft part, the original scan data of the aircraft part received from a test stage, and wherein the additional in-service data is automatically transmitted to a design stage, wherein the original scan data of the aircraft part includes part coordinates data for locating the part in the aircraft.

31. The non-transitory computer-readable medium of claim 30, wherein the in-service data includes in-service non-destructive evaluation data and in-service monitoring data, including an as-experienced load and as-experienced dimensions data automatically obtained from a plurality of different sensors while the aircraft part is in use.

32. The non-transitory computer-readable medium of claim 30, wherein the original scan data is compared with in-service non-destructive evaluation data after an event has occurred to an aircraft.

* * * * *